(12) United States Patent
Masse et al.

(10) Patent No.: US 8,869,995 B2
(45) Date of Patent: Oct. 28, 2014

(54) FRAMEWORK OF AN ELECTRICAL PANEL OR ENCLOSURE

(71) Applicant: Schneider Electric Industries SAS, Rueil Malmaison (FR)

(72) Inventors: Dominique Masse, Epinay sur Orge (FR); Mikael Dognon, Herblay (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 13/770,264

(22) Filed: Feb. 19, 2013

(65) Prior Publication Data

US 2013/0213907 A1    Aug. 22, 2013

(30) Foreign Application Priority Data

Feb. 21, 2012 (FR) ...................... 12 51565

(51) Int. Cl.
*A47B 43/00* (2006.01)
*A47B 47/00* (2006.01)
(Continued)

(52) U.S. Cl.
CPC .............. *H05K 5/0217* (2013.01); *A47B 43/00* (2013.01); *H02B 1/01* (2013.01); *H02B 1/30* (2013.01)
USPC .......... 211/26; 211/195; 361/724; 312/223.1; 312/265.1

(58) Field of Classification Search
CPC .............. H04Q 1/06; H04Q 1/00; H04Q 1/09; H04Q 1/02; H04Q 1/04; H04Q 1/08; H04Q 1/021; H04Q 2201/00; H04Q 2201/04; H04Q 2201/08; E04C 3/005; G06F 1/181; A47B 43/00; A47B 46/00; A47B 47/00; A47B 57/00; A47B 47/04; A47B 47/045; A47B 47/05; A47B 47/02; A47B 47/021; A47B 47/027; A47F 5/10; A47F 5/13; A47F 5/08; H05K 5/0217; H05K 7/18; H05K 5/00; H05K 5/02; H05K 5/0226; H05K 7/186; H02B 1/30; H02B 1/01; H02B 1/38; H02B 1/013; H02B 1/26; H02B 1/34
USPC ......... 312/258, 265.1–265.4, 223.1; 211/195, 211/198, 200, 201, 175, 26, 87.01; 248/917–924, 317, 274.1, 200; 361/724, 829, 600
See application file for complete search history.

(56) References Cited

U.S. PATENT DOCUMENTS 475,013 A * 5/1892 Hanley .............................. 312/6
(Continued)

FOREIGN PATENT DOCUMENTS

DE    28 01 252        6/1979
EP    1 855 513 A1    11/2007
JP    2005-45056        2/2005

OTHER PUBLICATIONS

French Preliminary Search Report and Written Opinion issued Oct. 19, 2012, in French 1251565, filed Feb. 21, 2012 (with English Translation of Categories of Cited Documents).

*Primary Examiner* — Jennifer E Novosad
(74) *Attorney, Agent, or Firm* — Oblon, Spivak, McClelland, Maier & Neustadt, L.L.P.

(57) ABSTRACT

The invention relates to a parallelepipedal framework (1) of an electrical panel or enclosure comprising:
  a first rectangular base (b1) and a second rectangular base (b2) each formed by four rails (10, 11),
  four lateral rails (12, 13, 14, 15) perpendicular to the bases and connecting the two bases together, forming four lateral faces (f1, f2, f3, f4) parallel in twos, two first parallel lateral faces (f1, f3) each comprising an oblique rail (16, 17) fastened along a diagonal of the said face, the four lateral rails (12, 13, 14, 15) and the two oblique rails (16, 17) comprising fastening ends articulated on each of the two bases (b1, b2) arranged to cause the said oblique rails (16, 17) and lateral rails (12, 13, 14, 15) to pivot on two planes formed by the said first lateral faces (f1, f3) so as to be able to maneuver the framework between a folded position and an unfolded position.

4 Claims, 3 Drawing Sheets

(51) Int. Cl.
   *A47B 57/00* (2006.01)
   *H05K 5/02* (2006.01)
   *H02B 1/01* (2006.01)
   *H02B 1/30* (2006.01)

(56) References Cited

U.S. PATENT DOCUMENTS

| | | | | |
|---|---|---|---|---|
| 1,255,407 | A * | 2/1918 | Goetz | 312/6 |
| 2,751,635 | A * | 6/1956 | Donnahue | 52/69 |
| 3,254,786 | A * | 6/1966 | Melville | 220/6 |
| 3,829,190 | A * | 8/1974 | Jackson | 312/258 |
| 3,917,310 | A * | 11/1975 | Mitsuishi | 280/756 |
| 3,918,510 | A * | 11/1975 | Hayward | 160/45 |
| 3,948,513 | A * | 4/1976 | Pfotenhauer | 482/142 |
| 4,482,184 | A * | 11/1984 | Mincey | 297/28 |
| 4,640,332 | A * | 2/1987 | Turner | 160/46 |
| 7,735,942 | B2 * | 6/2010 | Cheng et al. | 312/258 |
| 7,748,795 | B2 * | 7/2010 | Cheng et al. | 312/223.2 |
| 2007/0256995 | A1 | 11/2007 | Tenreiro et al. | |
| 2010/0078529 | A1 * | 4/2010 | Taylor | 248/68.1 |

\* cited by examiner

FRAMEWORK OF AN ELECTRICAL PANEL OR ENCLOSURE

TECHNICAL FIELD OF THE INVENTION

The present invention relates to a framework of an electrical panel or enclosure. The framework of the invention has the particular feature of being foldable.

PRIOR ART

An electrical panel or enclosure comprises a framework furnished with several rails to which enclosing panels are attached. The framework is mounted by attaching the rails together with the aid of screws. This mounting operation proves to be particularly protracted.

The object of the invention is to propose a framework for an electrical panel or enclosure of which the storage, the transport, the handling, the mounting and the installation are easy.

DESCRIPTION OF THE INVENTION

This object is achieved by a parallelepipedal framework of an electrical panel or enclosure comprising:
- a first rectangular base and a second rectangular base each formed by four rails,
- four lateral rails perpendicular to the bases and connecting the two bases together, forming four lateral faces parallel in twos,
- two first parallel lateral faces each comprising an oblique rail fastened along a diagonal of the said face,
- the two oblique rails are telescopic,
- the four lateral rails and the two oblique rails comprise fastening ends articulated on each of the two bases arranged to cause the said oblique rails and lateral rails to pivot on two planes formed by the said first lateral faces so as to be able to manoeuvre the framework between a folded position and an unfolded position.

According to a particular feature, the four lateral rails are telescopic and the two oblique rails and the four lateral rails comprise means for locking the position of the first base relative to the second base when the framework is in the unfolded position.

According to another particular feature, the locking means comprise several orifices made on the rails and locking members interacting with the said orifices.

According to another particular feature, the orifices are made over the length of each rail so as to adjust the size of the framework.

BRIEF DESCRIPTION OF THE FIGURES

Other features and advantages will become apparent in the following detailed description with respect to the appended drawings in which.

DETAILED DESCRIPTION OF AT LEAST ONE EMBODIMENT

The invention relates to a metal framework 1 for an electrical panel or enclosure. This framework 1 has the particular feature of being foldable, which allows it to be easily stored, transported and rapidly mounted by a single person.

Figure 2:
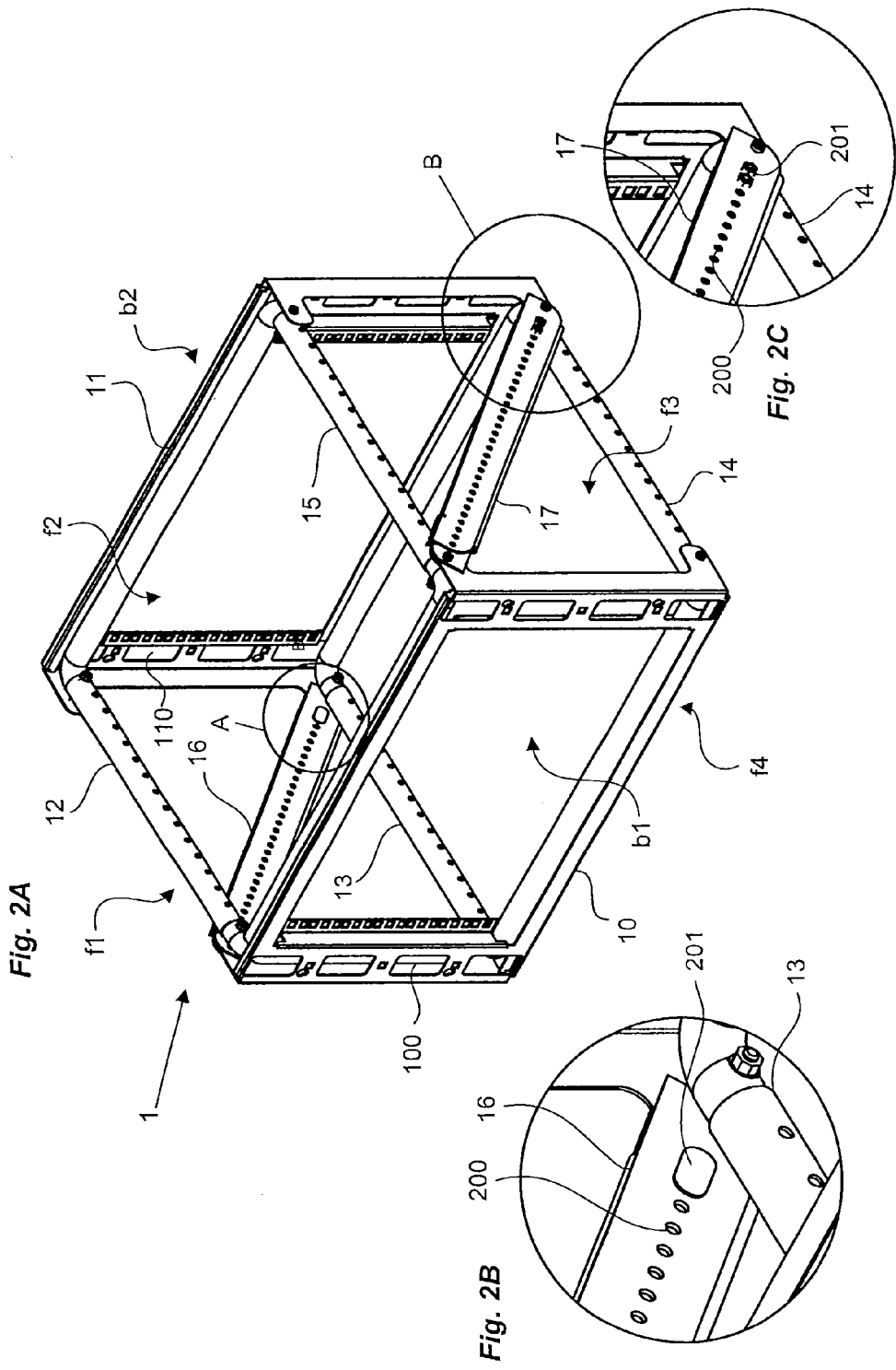
FIG. 2A represents the framework of the invention in the unfolded position.
FIG. 2B represents the detail A that is present in FIG. 2A.
FIG. 2C represents the detail B that is present in FIG. 2A.

In the unfolded position, the framework 1 has a rectangular parallelepipedal shape (FIG. 2A). It comprises two identical bases, a first base b1 and a second base b2 each formed of four rails 10, 11 assembled in a rectangle. The rails of the bases 10, 11 comprise for example apertures 100, 110 allowing the fastening of accessories or the passage of cables or leads between the front and the rear of the framework.

The two bases b1, b2 are mounted parallel and are assembled together by virtue of four lateral rails 12, 13, 14, 15. The four lateral rails are perpendicular to the two bases b1, b2 so as to form four lateral faces f1, f2, f3, f4 that are parallel in twos, called the first lateral faces f1, f3 and second lateral faces f2, f4. The four rails 10, 11 of each base b1, b2 and the lateral rails thus form the edges of the framework 1 of the invention. The two first lateral faces f1, f3 each comprise an oblique rail 16, 17 extending on the diagonal of the face. The two oblique rails 16, 17 are parallel and are oriented on one and the same oblique plane.

Figure 1:
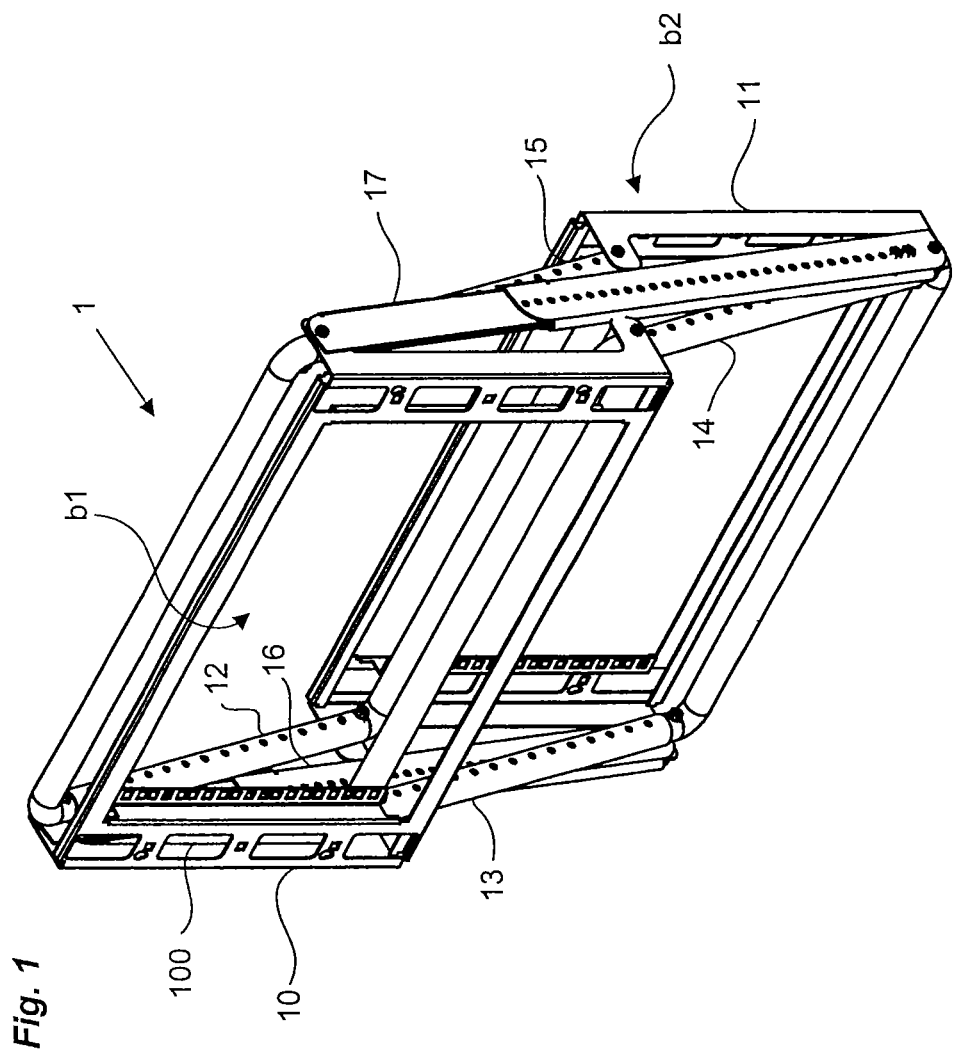
FIG. 1 represents the framework of the invention in the folded position.
Figure 3:
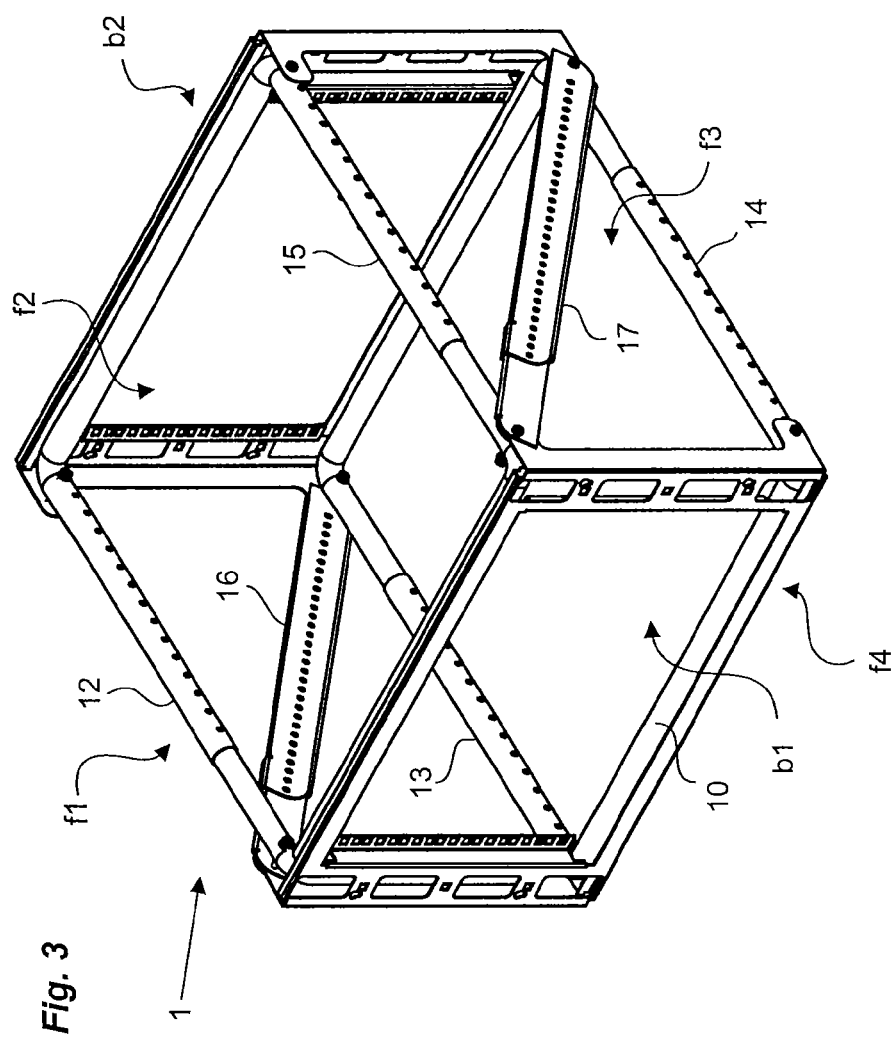
FIG. 3 represents the framework of the invention in the unfolded position and enlarged.

The four lateral rails 12, 13, 14, 15 and the two oblique rails 16, 17 each comprise two articulated fastening ends on each of the two bases b1, b2 so as to be able to pivot in the two planes formed by the said first lateral faces f1, f3. The framework 1 can therefore be folded and unfolded by pivoting the lateral rails 12, 13, 14, 15 and oblique rails 16, 17 about their ends in the two planes. For this, the oblique rails 16, 17 have a telescopic structure allowing the folding and the unfolding. The framework 1 of the invention can therefore adopt a folded position (FIG. 1) in which the two bases are brought towards one another and an unfolded position in which the framework forms a rectangular parallelepiped (FIGS. 2A and 3).

According to the invention, the four lateral rails 12, 13, 14, 15 preferably have a tubular shape, with circular section. They comprise a telescopic structure making it possible to be adjusted lengthwise. As the two oblique rails also have a telescopic structure allowing lengthwise adjustment, it is thus possible to adjust the distance separating the two bases in the unfolded position and thus to adjust the size of the electrical panel or enclosure formed from the said framework. FIG. 3 therefore shows the framework 1 of the invention in the unfolded position and enlarged.

The four lateral rails 12, 13, 14, 15 and the two oblique rails 16, 17 comprise orifices 200 (FIGS. 2B and 2C) in which locking members 201 are inserted making it possible to lock the unfolded position of the framework 1 and the size of the framework 1 in the unfolded position. These locking members 201 comprise for example one or more screws housed in the orifices 200 of the rails in order to lock their position lengthwise. In order to lock the framework 1 in position and size, other equivalent means may of course be used.

The framework 1 of the invention therefore has several advantages. It can easily be housed in a package and then, once brought to site, mounted rapidly without the need for considerable labour.

The invention claimed is:

1. A parallelepipedal framework of an electrical panel or enclosure comprising:
   a first rectangular base and a second rectangular base each formed by four rails,
   four lateral rails perpendicular to the bases and connecting the two bases together, forming two sets of two parallel lateral faces,
   wherein a first set of two parallel lateral faces each includes an oblique rail, a first end of each oblique rail being fastened adjacent a top end of the first rectangular base and a second end of each oblique rail being fastened adjacent a bottom end of the second rectangular base so that each oblique rail extends along a diagonal of the respective lateral face, wherein each of the two oblique rails are telescopic, wherein the four lateral rails and the two oblique rails comprise fastening ends articulated on each of the two bases arranged to cause the said oblique rails and lateral rails to pivot on two planes formed by the parallel lateral faces so as to be able to manoeuvre the framework between a folded position and an unfolded position, and wherein, when the framework is in the folded position, the first rectangular base and the second rectangular base are offset from each other in a plane parallel to the first set of two parallel lateral faces, wherein, when the framework is in the unfolded position, the oblique rails have a first length, and when the framework is in the folded position, the oblique rails are configured to telescope to a second length greater than the first length.

2. The framework according to claim 1, wherein the four lateral rails are telescopic and the two oblique rails and the four lateral rails comprise means for locking the position of the first base relative to the second base when the framework is in the unfolded position.

3. The framework according to claim 2, wherein the locking means comprise several orifices made on the rails and locking members interacting with the said orifices.

4. The framework according to claim 3, wherein the orifices are made over the length of each rail so as to adjust the size of the framework.

* * * * *